(12) United States Patent
Kinoshita et al.

(10) Patent No.: US 9,806,205 B2
(45) Date of Patent: Oct. 31, 2017

(54) N-TYPE ALUMINUM NITRIDE MONOCRYSTALLINE SUBSTRATE

(71) Applicant: Tokuyama Corporation, Yamaguchi (JP)

(72) Inventors: Toru Kinoshita, Yamaguchi (JP); Toru Nagashima, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 0 days.

(21) Appl. No.: 15/329,597

(22) PCT Filed: Jul. 21, 2015

(86) PCT No.: PCT/JP2015/070723
§ 371 (c)(1),
(2) Date: Jan. 27, 2017

(87) PCT Pub. No.: WO2016/017480
PCT Pub. Date: Feb. 4, 2016

(65) Prior Publication Data
US 2017/0222064 A1    Aug. 3, 2017

(30) Foreign Application Priority Data

Aug. 1, 2014 (JP) .................... 2014-158035

(51) Int. Cl.
*H01L 29/872* (2006.01)
*C30B 29/40* (2006.01)
(Continued)

(52) U.S. Cl.
CPC .......... *H01L 29/872* (2013.01); *C30B 25/10* (2013.01); *C30B 25/12* (2013.01); *C30B 25/20* (2013.01);
(Continued)

(58) Field of Classification Search
CPC .................... H01L 29/872; H01L 29/207
See application file for complete search history.

(56) References Cited

U.S. PATENT DOCUMENTS 6,870,125 B2    3/2005   Doi et al.
8,129,208 B2    3/2012   Koukitu et al.
(Continued)

FOREIGN PATENT DOCUMENTS

JP    2000-091234 A    3/2000
JP    2003-086816 A    3/2003
(Continued)

OTHER PUBLICATIONS

Boichot, R. "Epitaxial growth of AlN on C-plane sapphire by High Temperature Hydride Vapor Phase Epitaxy: Influence of the gas phase N/Al ratio and low temperature protective layer" Surface & Coatings Tech. 237 Aug. 2013 pp. 118-125.*
(Continued)

*Primary Examiner* — Asok K Sarkar
*Assistant Examiner* — Grant Withers
(74) *Attorney, Agent, or Firm* — Cahn & Samuels, LLP

(57) ABSTRACT

A silicon-doped n-type aluminum nitride monocrystalline substrate wherein, at a photoluminescence measurement at 23° C., a ratio (I1/I2) between the emission spectrum intensity (I1) having a peak within 370 to 390 nm and the emission peak intensity (I2) of the band edge of aluminum nitride is 0.5 or less; a thickness is from 25 to 500 μm; and a ratio (electron concentration/silicon concentration) between the electron concentration and the silicon concentration at 23° C. is from 0.0005 to 0.001.

7 Claims, 2 Drawing Sheets

(51) Int. Cl.
    *C30B 25/20* (2006.01)
    *C30B 25/12* (2006.01)
    *C30B 25/10* (2006.01)
    *H01L 29/207* (2006.01)
    *H01L 29/47* (2006.01)

(52) U.S. Cl.
    CPC .......... *C30B 29/403* (2013.01); *H01L 29/207* (2013.01); *H01L 29/47* (2013.01)

(56) References Cited

U.S. PATENT DOCUMENTS

| | | | |
|---|---|---|---|
| 9,013,026 | B2 | 4/2015 | Tsuchiya et al. |
| 2010/0001292 | A1* | 1/2010 | Yamasaki .......... H01L 21/02376 257/77 |
| 2010/0147211 | A1 | 6/2010 | Miyanaga et al. |
| 2016/0254391 | A1 | 9/2016 | Kinoshita et al. |

FOREIGN PATENT DOCUMENTS

| | | | |
|---|---|---|---|
| JP | 2003-168820 | A | 6/2003 |
| JP | 2003-273398 | A | 9/2003 |
| JP | 2006-016294 | A | 1/2006 |
| JP | 2006-100801 | A | 4/2006 |
| JP | 2009-059912 | A | 3/2009 |
| JP | 2010-089971 | A | 4/2010 |
| JP | 2014-051423 | A | 3/2014 |
| JP | 2014-073918 | A | 4/2014 |
| WO | 2007/111219 | A1 | 10/2007 |
| WO | 2008/096884 | A1 | 8/2008 |
| WO | 2015/056714 | A1 | 4/2015 |

OTHER PUBLICATIONS

English Abstract of JP 2000-091234.
English Abstract of JP 2003-086816.
English Abstract of JP 2003-168820.
English Abstract of JP 2003-273398.
English Abstract of 2006-016294.
English Abstract of JP 2006-100801.
English Abstract of JP 2009-059912.
English Abstract of JP 2010-089971.
English Abstract of JP 2014-051423.
English Abstract of JP 2014-073918.
English Abstract of WO 2007/111219.
English Abstract of WO 2008/096884.
English Abstract of WO 2015/056714.
Kumagai et al., Preparation of a Freestanding AlN Substrate from a thick AlN Layer Grown by Hydride Vapor Phase Epitaxy on a Bulk AlN Substrate Prepared by Physical Vapor Transport, Applied Physics Express 5 (2012) 055504, The Japan Society of Applied Physics.
Niagashima et al., Structural and Optical Properties of Carbon-Doped AlN Substrates Grown by Hydride Vapor Phase Epitaxy Using AlN Substrates Prepared by Physical Vapor Transport, Applied Physics Express 5 (2012) 125501, The Japan Society of Applied Physics.
International Preliminary Report on Patentability dated Feb. 2, 2017.
Nam et al., "Deep Impurity Transitions Involving Cation Vacancies and Complexes in AlGaN alloys", Applied Physics Letters, 86, 222108 to 222108-3 (2005).
Taniyasu et al., "Increased Electron Mobility in n-Type Si-doped AlN by Reducing Dislocation Density", Applied Physics Letters, 89, 182112 to 182112-3 (2006).
Slotte et al., "Influence of Silicon Doping on Vacancies and Optical Properties of $Al_xGa_{1-x}N$ Thin Films", Applied Physics Letters, 90, 151908 to 151908-3 (2007).
Stampfl et al., "Doping of $Al_xGa_{1-x}N$", Applied Physics Letters, 72 (4), 459-461 (1998).
Herro et al., "Growth of AlN Single Crystalline Boules", Journal of Crystal Growth 312, 2519-2521 (2010).

* cited by examiner

N-TYPE ALUMINUM NITRIDE MONOCRYSTALLINE SUBSTRATE

This application is a U.S. national stage application of PCT/JP2015/070723 filed on 21 Jul. 2015 and claims priority to Japanese patent document 2014-158035 filed on 1 Aug. 2014, the entireties of which are incorporated herein by reference.

TECHNICAL FIELD

The present invention relates to a silicon doped n-type single crystal aluminum nitride substrate (n-type aluminum nitride single crystal substrate).

BACKGROUND OF THE INVENTION

At present time, silicon is mainly used as the material of the powder device; however as the material capable of realizing the power device with even higher performances, the wide band gap semiconductors such as gallium nitride or silicon carbide or so have attracted attention. Aluminum nitride has even wider band gap energy (6.2 eV) compared to these materials, and also have better dielectric breakdown voltage (12 MV/cm), and better thermal conductivity (3.0 $Wcm^{-1}K^{-1}$), hence aluminum nitride is capable of realizing a power device having even higher withstand voltage characteristic than in case of using the above mentioned materials.

For the device structure using gallium nitride and silicon carbide which attains high element performance (a large capacity, and a high withstand voltage), the vertical type semiconductor structure with conductive substrate as the supporting substrate, that is the electric current flows or the voltage is applied between the surface of the device and the backside is proposed (the patent articles 1 to 3). By employing the vertical type structure, the withstand voltage characteristic can be improved which was the object of the horizontal type device wherein the flowing direction of the electric current for driving the device is in the horizontal direction. Further, by employing the vertical type structure, a larger electric power can be applied to the device. Also, as the device which is effective to have the vertical structure, the luminescence device such as semiconductor laser or so may be mentioned. By employing the vertical type device structure, the electric current concentrating at the edge of mesa structure which is the problem of the horizontal type structure can be avoided, and a uniform electric current can be introduced to an active layer, thus the reliability of the device can be improved.

In order to realize such vertical type element structure, as mentioned in the above, the conductive substrate must be used. In regards with aluminum nitride having the conductivity, the method of forming the n-type conductive crystal layer by Si doping using metalorganic vapor phase epitaxy (MOVPE) method or a hydride vapor phase epitaxy (HVPE) method or so is known (the patent articles 4 to 6).

However, in the patent articles 4, 5 and 6, the n-type aluminum nitride single crystal layer is formed on the foreign substrate such as sapphire substrate or SiC substrate; hence it was difficult to produce the n-type aluminum nitride single crystal layer having high quality and a thickness sufficient enough to be used as the substrate.

On the other hand, as the method for forming a high quality aluminum nitride single crystal layer, the method which grows the aluminum nitride single crystal layer on the base substrate formed from same material that is the substrate formed from the aluminum nitride single crystal is also developed (the non-patent article 1). According to the method described in the non-patent article 1, a highly pure aluminum nitride thick film layer having the crystalline quality as same as the aluminum nitride single crystal base substrate can be formed. Further, according to this method, the n-type aluminum nitride single crystal with dislocation density of $10^6$ $cm^{-2}$ or so can be obtained.

Also, the example of forming the thick film of aluminum nitride on aluminum nitride base substrate by the chemical vapor phase growth is also described in the patent article 7 and in the non-patent article 2.

Also, as the method for stably growing the group III nitride single crystal having a low dislocation density and a good crystallinity, a physical vapor phase growth method such as a sublimation method or so is known. According to the sublimation method, a thick group III nitride single crystal can be obtained. The patent article 8 describes to carry out the sublimation under the presence of the impurity elements such as Si or so in order to increase the growth rate of the group III nitride single crystal and to improve the crystallinity.

PRIOR ART

Patent Articles

[Patent Article 1] JP Patent Application Laid Open No. 2003-086816
[Patent Article 2] JP Patent Application Laid Open No. 2006-100801
[Patent Article 3] JP Patent Application Laid Open No. 2009-059912
[Patent Article 4] JP Patent Application Laid Open No. 2000-091234
[Patent Article 5] JP Patent Application Laid Open No. 2003-273398
[Patent Article 6] WO2008/096884
[Patent Article 7] WO2015/056714
[Patent Article 8] WO2007/111219

Non-Patent Articles

[Non-Patent Article 1] Appl. Phys. Express.5(2012) 055504
[Non-Patent Article 2] Appl. Phys. Express.5(2012) 125501

As described in the patent article 8, according to the sublimation method, a thick group III nitride single crystal having low dislocation density and good crystallinity can be obtained. Further, in the aluminum nitride single crystal obtained by the method of the patent article 8, silicon (Si) is incorporated as the impurity element. If the incorporated silicon acts as the donor, the obtained single crystal can expect to have n-type conductivity. However, in some case, the aluminum nitride single crystal with silicon obtained by the sublimation method does not exhibit the n-type conductivity as much as it is expected from the content of silicon, which is thought due to the influence from other impurities, or the point defect wherein aluminum and nitrogen are missing.

According to the chemical vapor phase growth method using the same material substrate as described in the non-patent articles 1 and 2 and the patent article 7, the aluminum nitride thick layer having high crystalline quality and high purity can be formed. Further, the aluminum nitride thick layer (substrate) which exhibits the n-type conductivity is described in the patent article 7. However, recently, the aluminum nitride single crystal substrate which exhibits even higher n-type conductivity is in demand, thus the known arts had room for improvements.

Silicon which has been doped to the aluminum nitride single crystal is partially thermally activated and acts as the donor, however as a result of being compensated by the above mentioned other impurities and the point defect, it does not act as the donor, but a lot of those will exist as foreign matter in the crystal, hence it does not contribute to the n-type conductivity. Such silicon which does not contribute to the n-type conductivity may damage the crystallinity, and also thought to cause the dislocation or undesired coloring as well. Therefore, by suppressing the incorporation of the other impurities and the point defects which are the cause of compensation of silicon, the n-type aluminum nitride single crystal substrate wherein many of the doped silicon can contribute to the n-type conductivity is demanded.

Therefore, the present invention is attained in view of such situation, and the object is to provide the free-standing n-type aluminum nitride single crystal substrate wherein silicon is doped and have high n-conductivity.

In order to solve the above mentioned problems, the present inventors have carried out keen examination. As a result of the keen examination of various production conditions, by reducing the ratio of the aluminum (Al) defect which compensates the n-type conductivity, the acceptor compensation center density which lowers the n-type conductivity is lowered, thus it was found that the high quality n-type single crystal aluminum nitride layer having high n-type conductivity and a thickness which can be used as the free-standing substrate can be formed, thereby the present invention was attained. The mechanism of improving the n-type conductivity is not necessarily clear, however it is thought that by selecting an appropriate growth condition, the ratio of other impurities which becomes the compensation center of the silicon and the ratio of the aluminum defect will decrease, thus the silicon ratio functioning as the donor will increase.

That is, the first aspect of the present invention is the silicon doped n-type aluminum nitride single crystal substrate, wherein a ratio ($I_1/I_2$) between a luminescence spectrum intensity ($I_1$) of a peak at 370 to 390 nm and a luminescence peak intensity ($I_2$) of a band edge of aluminum nitride is 0.5 or less by a photoluminescence measurement at 23° C., a thickness is 25 to 500 μm, and a ratio between an electron concentration and a silicon concentration (an electron concentration/a silicon concentration) at 23° C. is 0.0005 to 0.001. Although it will be described in detail in below, the luminescence spectrum intensity ($I_1$) of the peak at 370 to 390 nm is known to represent the amount of Al defect. Also, the luminescence peak ($I_2$) of the band edge of aluminum nitride can be confirmed around 210 nm.

Further, the n-type aluminum nitride single crystal substrate of the present invention preferably has the acceptor concentration included in said n-type aluminum nitride single crystal of $10^{18}$ cm$^{-3}$ or less and does not exceed the silicon concentration. By satisfying such condition, good n-type conductivity can be obtained.

Also, the n-type aluminum nitride single crystal substrate of the present invention preferably has a dislocation density of $10^6$ cm$^{-2}$ or less. By satisfying such condition, the device with low resistance and high reliability which uses the n-type aluminum nitride single crystal substrate of the present invention can be produced.

Further, the n-type aluminum nitride single crystal substrate of the present invention preferably has the electron concentration at 23° C. of $1 \times 10^{13}$ to $1 \times 10^{17}$ cm$^{-3}$.

The second aspect of the present invention is the vertical nitride semiconductor device comprising an electrode layer on top and bottom of principal planes of said n-type aluminum nitride single crystal substrate.

According to the present invention, the free-standing n-type aluminum nitride single crystal substrate having high n-type conductivity which has not been realized yet is provided, and the vertical semiconductor device which uses the n-type aluminum nitride substrate can be produced. Note that, this vertical nitride semiconductor device has electrodes which are formed at the top and bottom planes of the n-type aluminum nitride single substrate, and it can be used for various semiconductor devices such as a Schottky barrier diode, a transistor, a light emitting diode, a laser diode or so.

DETAILED DESCRIPTION OF THE INVENTION (The n-type Aluminum Nitride Single Crystal Substrate)

In the present invention, the n-type aluminum nitride single crystal substrate is the substrate formed of the aluminum nitride single crystal including silicon as the donor. The n-type substrate is a semiconductor substrate wherein the electric current is generated by applying the voltage, and free electron is used as the carrier carrying the electric charge. The free electron having the negative charge moves as the carrier, and thereby the electric current is generated. That is, it is the substrate wherein electrons become major carriers.

The n-type aluminum nitride single crystal substrate of the present invention has a ratio ($I_1/I_2$) between a luminescence spectrum intensity ($I_1$) of a peak at 370 to 390 nm and a luminescence peak intensity ($I_2$) of a band edge of aluminum nitride of 0.5 or less by a photoluminescence measurement at 23° C.

In the photoluminescence measurement at 23° C., the luminescence spectrum peaking at 370 to 390 nm is reported as the Al defect which compensate the n-type conductivity (for example see Appl.Phys.Lett.86(2005)222108). Also, it is suggested that the luminescence spectrum of a peak at 370 to 390 nm has a stronger luminescence peak intensity along with the increase of the impurity amount mixed in (for example see Appl.Phys.Lett.90(2007)151908). On the other hand, the band gap of the aluminum nitride can be observed around 210 nm.

Figure 2:
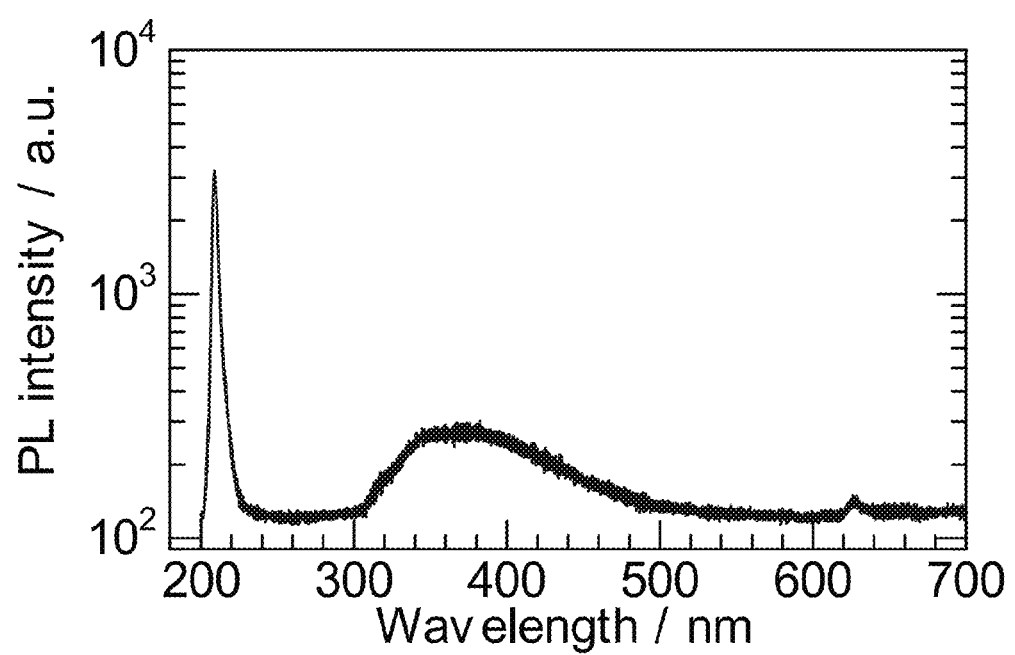
FIG. 2 illustrates a graph of an intensity pattern of a silicon doped aluminum nitride.

The n-type aluminum nitride single crystal substrate has a ratio ($I_1/I_2$) between luminescence spectrum intensity ($I_1$) of a peak at 370~390 nm and a luminescence peak intensity ($I_2$) near a band edge (about 210 nm) of aluminum nitride of 0.5 or less (FIG. 2). In case the intensity ratio of the luminescence peak ($I_1/I_2$) exceeds 0.5, it is not preferable because the n-type conductivity decreases. In order to maintain the high n-type conductivity, the intensity ratio of the luminescence peak ($I_1/I_2$) is preferably 0.3 or less, and more preferably 0.2 or less. The lower the intensity ratio of the luminescence peak ($I_1^H{}_2$) is, the more preferable it is, however from the point of industrial productivity, the lower limit is 0.001.

Also, the n-type aluminum nitride single crystal substrate of the present invention has a thickness of 25 to 500 µm. The thickness of the substrate may be determined within the above mentioned range depending on the desired use and design. If the thickness of the substrate is less than 25 µm, a free-standing property as the substrate may be difficult to secure, and further it may cause the crack during the device production process, which will reduce the production yield hence it is not preferable. On the other hand, if the thickness of the substrate exceeds 500 µm, the time for producing the n-type aluminum nitride single crystal substrate will be longer which will be discussed in below thus the productivity will decline, and also it may become the cause of the increase of the resistance value in the vertical direction for the characteristic plane of the device. The thickness of the n-type aluminum nitride single crystal substrate is preferably 30 to 300 µm, and more preferably 50 to 200 µm.

The n-type aluminum nitride single crystal substrate of the present invention has a ratio between an electron concentration and a silicon concentration (an electron concentration/a silicon concentration) at 23° C. of 0.0005 to 0.001. A high ratio of the electron concentration and the silicon concentration means that the ratio of the silicon which contributes to the electron conduction increases, which also means a high donor activation ratio. Also, from the different point of view, when the ratio between the electron concentration and the silicon concentration is high, this means that the amount of the acceptor defect which compensates the n-type conductivity is low, or it means that the incorporated amount of the acceptor impurity such as carbon, magnesium, and calcium or so is low. As a result, the reliability and the n-type conductivity of the device improve. The ideal value of the ratio between the electron concentration and the silicon concentration is 1, that is all of the doped silicon contributes to the electron conduction. However, when considering the activation energy of the silicon in the aluminum nitride, the upper limit is 0.001 or so although it should not be limited thereto. Therefore, the ratio between the electron concentration and the silicon concentration at room temperature is preferably 0.0007 to 0.001.

The electron concentration at 23° C. is preferably controlled within the arbitrarily wide range in order to attain the desired device characteristic. In order to obtain the vertical device capable of being used in wide range, it is preferably $1 \times 10^{13}$ to $1 \times 10^{17}$ cm$^{-3}$. Note that, the optimum value of the electron concentration differs depending on the device, but it is determined within the range of $1 \times 10^{13}$ to $1 \times 10^{17}$ cm$^{-3}$, preferably $1 \times 10^{14}$ to $1 \times 10^{17}$ cm$^{-3}$, and more preferably $5 \times 10^{"}$ to $1 \times 10^{17}$ cm$^{-3}$ depending on the purpose of the device using the n-type aluminum nitride single crystal substrate.

On the other hand, the silicon concentration in the n-type aluminum nitride single crystal substrate may be determined so that the electron concentration and the ratio between the electron concentration and the silicon concentration satisfy the above mentioned ranges. The electron concentration can be measured by a Hall effect measurement and CV measurement or so, however the electron concentration defined in the present invention is measured using the Hall effect measurement at the temperature of 23° C. The silicon concentration is quantified by SIMS analysis using cesium ion as the primary ion.

Also, the n-type aluminum nitride single crystal substrate of the present invention has the acceptor concentration included in the crystal of $10^{18}$ cm$^{-3}$ or less and does not exceed the silicon concentration. The acceptor concentration in the n-type aluminum nitride single crystal substrate can be calculated from the temperature dependency of the electron concentration as similar to the n-type aluminum thin film described in the non-patent article (Appl.Phys.Lett.89(2006) 182112). As the element which functions as the acceptor in the n-type aluminum nitride single crystal, the acceptor defect and the acceptor impurity may be mentioned, and the total sum thereof is considered equal to the acceptor concentration in the crystal. As the acceptor impurity, carbon, magnesium, calcium or so may be mentioned, however it is not limited thereto. The acceptor impurity concentration can be measured by the known method such as by secondary ion mass spectrometry (SIMS) or so.

The acceptor concentration is equal or less than silicon concentration, and the lower it is, the more preferable it is, because the ratio between the electron concentration and the silicon concentration (the electron concentration/the silicon concentration) is higher. Therefore, the acceptor concentration is preferably less than the silicon concentration, and $10^{18}$ cm$^{-3}$ or less, more preferably $10^{16}$ cm$^{-3}$ or less, and most preferably $10^{15}$ cm$^{-3}$ or less. Also, the lower limit thereof is ideally 0, however considering the inevitable mixing, and measuring accuracy and the detection limit of the impurity concentration; it is $10^{10}$ cm$^{-3}$ or so.

Also, the n-type aluminum nitride single crystal substrate of the present invention preferably has the dislocation density of $10^6$ cm$^{-2}$ or less.

The dislocation in the n-type aluminum nitride single crystal substrate causes to lower the mobility of the electron, and as a result, the n-type conductive characteristic decreases. Also, in case of using the n-type aluminum nitride single crystal of the present invention as the vertical device substrate, the dislocation may become the cause of the leak of the electric current, thus the reliability of the device is decreases. In order to suppress the lowering of the n-type conductive characteristic and the device reliability, the dislocation density in the n-type aluminum nitride single crystal substrate is preferably $10^6$ cm$^{-2}$ or less, and more preferably $10^4$ cm$^{-2}$ or less. The preferable lower limit of the dislocation density is 0 cm$^{-2}$, however from the point of the industrial production, it is $10^2$ cm$^{-2}$. The dislocation density can be measured by the observation using the transmission electron microscope (TEM), or by immersing in the alkaline solution and observing the etch pit density. Note that, in the present invention, the etch pit density is the dislocation density.

In addition, the orientation of the principal plane of the n-type aluminum nitride single crystal substrate is C plane (Al polarity plane) and —C plane (N polarity plane), and it may be a plane comprising the off angle being inclined to M axis and A axis depending on the purpose. The off angle is not particularly limited; however in general it is 0 to 3° or so.

Also, in the n-type aluminum nitride single crystal substrate of the present invention, preferably the donor impurity other than silicon is as low as possible. Specifically, if the donor impurity amount other than silicon such as germanium, tin and oxygen or so is large, the effective donor activation ratio deteriorates, and in some cases the problem such as the lowering of the ratio of the electron concentration against silicon concentration or so may occur. Thus, the impurity concentration other than silicon which functions as the donor impurity is equal or less than the silicon concentration, and $10^{17}$ cm$^{-3}$ or less, more preferably $10^{16}$ cm$^{-3}$ or less.

(The Production Method of the n-type Aluminum Nitride Single Crystal Substrate)

Next, the production method of the n-type aluminum nitride single crystal substrate of the present invention will be explained. First, the aluminum nitride single crystal seed substrate used for producing the n-type aluminum nitride single crystal substrate is prepared. On this aluminum nitride single crystal seed substrate, the n-type aluminum nitride single crystal layer is grown by various methods, and then by separating single crystal layer from the seed substrate, the n-type aluminum nitride single crystal substrate is produced.

(The Aluminum Nitride Single Crystal Seed Substrate)

The dislocation density of the aluminum nitride single crystal seed substrate is $10^4$ cm$^{-2}$ or less, and preferably $10^{-3}$ cm$^{-2}$ or less. If the dislocation density exceeds $10^4$ cm$^{-2}$, when forming the n-type aluminum nitride single crystal layer on the aluminum nitride single crystal seed substrate, the stress is accumulated in the n-type aluminum nitride single crystal film, and the crack tends to easily occur as the film becomes thicker. Also, if the dislocation density exceeds $10^4$ cm$^{-2}$, it tends to become difficult to obtain n-type aluminum nitride single crystal layer (the n-type aluminum nitride single crystal substrate) with the dislocation density of $10^6$ cm$^{-2}$ or less. Further, if the dislocation density of the n-type aluminum nitride single crystal layer exceeds $10^6$ cm$^{-2}$, numerous hillocks are formed on the surface of the grown n-type aluminum nitride single crystal layer, and along with that the surface smoothness tends to decrease. When such phenomenon occurs, not only the crystalline quality of the n-type aluminum nitride single crystal layer decreases, but the impurity concentration other than silicon increases which is mixed unintentionally in the n-type aluminum nitride single crystal layer, and the n-type conductivity of the obtained n-type aluminum nitride single crystal substrate decreases.

Note that, the lower limit of the dislocation density of the aluminum nitride single crystal seed substrate is 0 cm$^{-2}$; however from the point of the industrial production, it is $10^2$ cm$^{-2}$. The dislocation density can be measured by the observation using the transmission electron microscope (TEM), or by immersing in the alkaline solution and observing the etch pit density. Note that, in the present invention, the etch pit density is the dislocation density.

The aluminum nitride single crystal seed substrate having a low dislocation density shown in the above can be produced by known methods. Further, as long as the above mentioned characteristic can be obtained, the method thereof is not particularly limited, and the sublimation method (for example see Journal of Crystal Growth. 312.2519), and the method proposed in JP Patent Application Laid Open No. 2010-89971 or so can be used.

For the aluminum nitride single crystal seed substrate, the principal plane where the n-type aluminum nitride single crystal layer is grown is preferably the C-plane. Further, the surface roughness of the principal plane is preferably smooth in the atomic layer level in order to prevent the decrease of crystalline quality of the n-type aluminum nitride single crystal layer. Specifically, the surface roughness is preferably 0.2 nm or less in root means square surface roughness (RMS) in the entire the principal plane of the seed substrate. When the surface roughness exceeds the above mentioned range, or when scars caused by the polishing exist on the principal plane of the seed substrate, this will become the cause of the cracks on the n-type aluminum nitride single crystal layer which is similar to the case of having a large dislocation density.

The orientation of the principal plane where the n-type aluminum nitride single crystal layer is grown is preferably C-plane, and the inclination of C-plane is not particularly limited, however it is preferably 0 to 3° or so.

Also, the thickness of the aluminum nitride single crystal seed substrate is not particularly limited, and usually it is 0.3 to 1.0 mm or so. By preparing such seed substrate, the n-type aluminum nitride single crystal layer having high crystalline quality can be formed.

(The Growth Method of the n-Type Aluminum Nitride Single Crystal Layer on the Seed Substrate)

Next, the growth method of the n-type aluminum nitride single crystal layer on this aluminum nitride single crystal seed substrate will be discussed.

The n-type aluminum nitride single crystal layer is produced by known crystal growth methods such as HVPE method, MOVPE method and Molecule Beam Epitaxy (MBE) method or so. Among these, considering the productivity that a single crystal layer with high quality can be obtained at a high crystal growth rate, HVPE method or MOVPE method is preferable; and HVPE method is most preferable since single crystal layer with high quality can be obtained at highest growth rate.

(The Growth Method of the n-type Aluminum Nitride Single Crystal Layer by HVPE Method)

When using HVPE method, halogenated alumina (for example, trichloride aluminum gas or so) as aluminum source, ammonium as nitrogen source, and SiH$_\alpha$Cl$_{4-\alpha}$ ($\alpha$ is an integer of 0 to 3) as silicon source are supplied together with the carrier gas such as hydrogen and nitrogen on the aluminum nitride single crystal seed substrate, and the n-type aluminum nitrogen single crystal layer is grown. Other than that, a silicon supplying source material such as quartz (SiO$_2$) and silicon (Si) or so as silicon source can be used.

The temperature of the seed substrate when growing the n-type aluminum nitride single crystal layer is preferably 1200 to 1500° C., more preferably 1350 to 1450° C., even more preferably 1400 to 1450° C., and most preferably 1410 to 1440° C. In general, when growing the n-type nitride semiconductor layer by doping Si, a strain is accumulated in the single crystal layer due to the silicon doping during the growth, thus it is known to generate cracks or so. However, as mentioned in the above, by growing the n-type aluminum nitride single crystal at a high temperature such as 1200° C. or higher or preferably at 1350° C. or higher, even if the film thickness is 25 μm or more, it is possible to significantly reduce the generation of dislocations and cracks or so during the growth. Generally, as the temperature of the seed substrate becomes high during the growth of the n-type aluminum nitride single crystal layer, the temperature of the parts surrounding the substrate also becomes high, thus the amount of the incorporated impurity from the surrounding materials tends to increase. Also, along with the increase of the growth rate of single crystal layer, the impurity derived from the source material gas such as chlorine or so also increases. Therefore, if the temperature of the substrate is too high, or if the growth rate of single crystal layer is too fast, the ratio between the electron concentration and the silicon concentration (the electron concentration/the silicon concentration) in the n-type aluminum nitride single crystal layer decreases, thus it may be less than 0.0005. This is speculated because a large part of the silicon which was doped in the aluminum nitride single crystal exists as the foreign matter, and does not contribute to the n-type conductivity. On the other hand, by regulating the growth rate appropriately, a large part of the doped silicon will contribute to the n-type conductivity. The reason for this is not necessarily clear, however by making the growth rate relatively slow, the unintentional impurity incorporation, and the aluminum defect are suppressed hence more silicon acts as the donor. Therefore, the temperature of the seed substrate during the growth of the n-type aluminum nitride single crystal layer is preferably 1500° C. or less, more preferably 1450° C. or less, and particularly preferably 1440° C. or less.

Further, the supplying mol ratio (V/III ratio) between the gas as the nitrogen source gas such as ammonia or so and the gas as the aluminum source is preferably 0.5 to 100, and more preferably 2 to 20 although it depends on the structure of the used crystal growth reactor. Note that, when the nitrogen is used as the carrier gas, the nitrogen included in the carrier gas is not counted in the above mentioned V/III ratio. When the V/III ratio is low (that is when Al atom is excessively supplied), the growth rate tends to decrease. Also, if the halogenated aluminum as the aluminum source is supplied excessively, the halogen may remain in the single crystal layer as the impurity.

Also, the growth rate of the n-type aluminum nitride aluminum single crystal layer is not particularly limited as long as it is within the range which does not deteriorate the n-type conductivity and the luminescence characteristic, however it is preferably 10 to 100 µm/h, more preferably 10 to 50 µm/h, even more preferably 15 to 30 µm/h, and particularly preferably 15 to 20 µm/h. Considering the industrial productivity, the larger the growth rate is more preferable; however as the growth rate becomes larger, the hillocks are formed on the growth surface, and the crystalline quality tends to decrease.

The condition of the above mentioned temperature of the seed substrate, V/III ratio, and the growth rate has different optimum value depending on the size and the shape of the used reactor; hence the optimum value may be determined within the above mentioned range.

As the doping method of the silicon when growing the n-type aluminum nitride single crystal layer, for example, the method of doping which uses $SiH_\alpha Cl_{4-\alpha}$ ($\alpha$ is an integer of 0 to 3) gas as the silicon source is preferably used. In case of making the silicon concentration constant in the film thickness direction, the flow rate of $SiH_\alpha Cl_{4-\alpha}$ gas may be held constant during the growth of the n-type aluminum nitride single crystal layer. Also, as other method for doping the silicon, the method of doping by using the decomposed silicon from the silicon supplying source material such as quartz and silicon which is put near the susceptor which heats the aluminum nitride single crystal seed substrate and also at the upstream of the seed substrate can be used. The content of silicon may be determined accordingly by regulating the supplying amount of $SiH_\alpha Cl_{4-\alpha}$ gas, the amount of the silicon supplying source material and the arrangements. Note that, in case of the condition of doping excess amount of silicon, the intensity ratio ($I_1/I_2$) of the luminescence peak of the obtained n-type aluminum nitride single crystal layer (the substrate) tends to increase, and the n-type conductivity decreases hence it is not preferable.

By employing the method as mentioned in the above, the silicon doped n-type aluminum nitride single crystal layer with a high quality and a free-standing property can be formed; however in general the growth condition will be influenced largely by the structure of the crystal growth reactor. For example, changes of the linear velocity of the supplying source material gas depending on the difference in the structure of the gas supplying part and the flow of source gas depending on the difference of the structure of the part to be heated may be mentioned. Due to such differences, the effective supplying amount and the supplying ratio of the Al source material and N source material on the seed substrate are expected to be different depending on the reactor. Therefore, by adjusting the growth condition appropriately within the range of the above mentioned parameter, the n-type conductive characteristic and the luminescence characteristic of the present invention can be realized.

The non-patent article (Appl.Phys.Lett.72(1998)459) shows that when doping silicon, the forming energy of the Al defect tends to decrease with increasing the doping amount. As mentioned in the above, from the point of suppressing the cracks generation, the growth at high temperature is preferable; however on the other hand, when high concentration silicon is doped, as the means for suppressing the Al defect formation, as discussed in the above mentioned non-patent article, it is preferable to lower the growth temperature. From the point of both suppressing the crack and suppressing of Al defect, the growth temperature is 1350 to 1450° C., more preferably 1400 to 1450° C., and particularly preferably 1410 to 1440° C.

Also, by setting the growth rate low along with the increase of the silicon doping amount, the Al defect is suppressed, the luminescence characteristic and the n-type conductivity of the n-type aluminum nitride single crystal of the present invention can be attained.

In the present invention, in order to grow (produce) the n-type aluminum nitride single crystal layer (substrate) having a good crystallinity and a free-standing property, for example, (1) the growth temperature is within the range of 1350 to 1450° C., preferably 1400 to 1450° C., and more preferably 1410 to 1440° C., (2) the V/III ratio is 5 to 20, (3) the growth rate of the n-type aluminum nitride single crystal is 15 to 30 µm/h, and more preferably 15 to 20 µm/h, and (4) the growth pressure is 700 to 760 Torr, and more preferably 740 to 760 Torr. The growth parameters of these (1) to (4) may be regulated within the preferable range of the present invention although the specific conditions may be different depending on the device for growing the n-type aluminum nitride layer. For the reactor used in the present invention, by satisfying the conditions of the above mentioned (1), (2) and (3), the n-type aluminum nitride single crystal layer having excellent characteristic can be produced. As the specific standard for selecting the production conditions, (1) the higher the growth temperature is, the faster the growth rate tends to be, and (2) the lower the V/III ratio is, the faster the growth rate tends to be. Further, (3) the faster the growth rate is, the ratio between the electron concentration and the silicon concentration (the electron concentration/the silicon concentration) in the obtained n-type aluminum nitride single crystal layer tends to decrease, and it may become less than 0.0005. Therefore, for example, if the growth rate is too fast, the growth rate is preferably regulated to be within the appropriate range by increasing the V/III ratio or so.

It is not clear why the ratio between the electron concentration and the silicon concentration (the electron concentration/the silicon concentration) decreases when the growth rate is fast, however the present inventors speculates as discussed in below. That is, when the growth rate becomes fast, along with the increase of the ratio of the aluminum chloride, the incorporated amount of the unintentional impurity such as chlorine (Cl) or so increases, as a result the ratio between the electron concentration and the silicon concentration are thought to decrease. Also, when the growth rate becomes fast, the defects included in the n-type aluminum nitride single crystal layer tends to increase (the increase of the etch pit density), hence these defects are thought to be causing the decrease of the ratio between the electron concentration and the silicon concentration. Therefore, in the present invention, it is thought that the growth rate is preferably relatively low.

The thickness of the n-type aluminum nitride single crystal layer grown by the method as discussed in the above is not particularly limited, however a part of the single crystal layer may be removed at the separation step which will be discussed in below, hence the thickness is set thicker than the desired n-type aluminum nitride single crystal substrate. Therefore, the n-type aluminum nitride single crystal layer is preferably 25 to 600 μm.

(The Separation Method)

After producing the multilayer substrate wherein the n-type aluminum nitride single crystal layer is formed on the aluminum nitride single crystal seed substrate according to the above mentioned method, the seed substrate and the n-type aluminum nitride single crystal layer are separated. The separation method will be described in below.

The method of separation is not particularly limited, and the known arts described in below as the example can be used. For example, the method of mechanically polishing the seed substrate part after producing the multilayer substrate; the method of melting the seed substrate part only by immersing in the alkaline solution such as the potassium hydroxide; or the method of separation by irradiating the laser light as proposed in JP Patent Application Laid Open No. 2003-168820 or so may be mentioned. Thereby, the free-standing n-type aluminum nitride single crystal substrate can be obtained. The plane at the side where the aluminum nitride single crystal seed substrate has been separated according to the above mentioned method, and the plane of opposite side thereof (the growth plane) are carried out with the chemical polishing (CMP), and the damage layer caused by the mechanical polishing and the surface oxidation after the growth is removed, thereby the smoothness is preferably improved. Note that, the order for carrying out the CMP polishing of the growth surface is not limited to after the separation, and it may be determined appropriately; and for example it may be carried out after growth of the n-type aluminum nitride single crystal layer.

(The Production Method of the Semiconductor Device)

Figure 1:
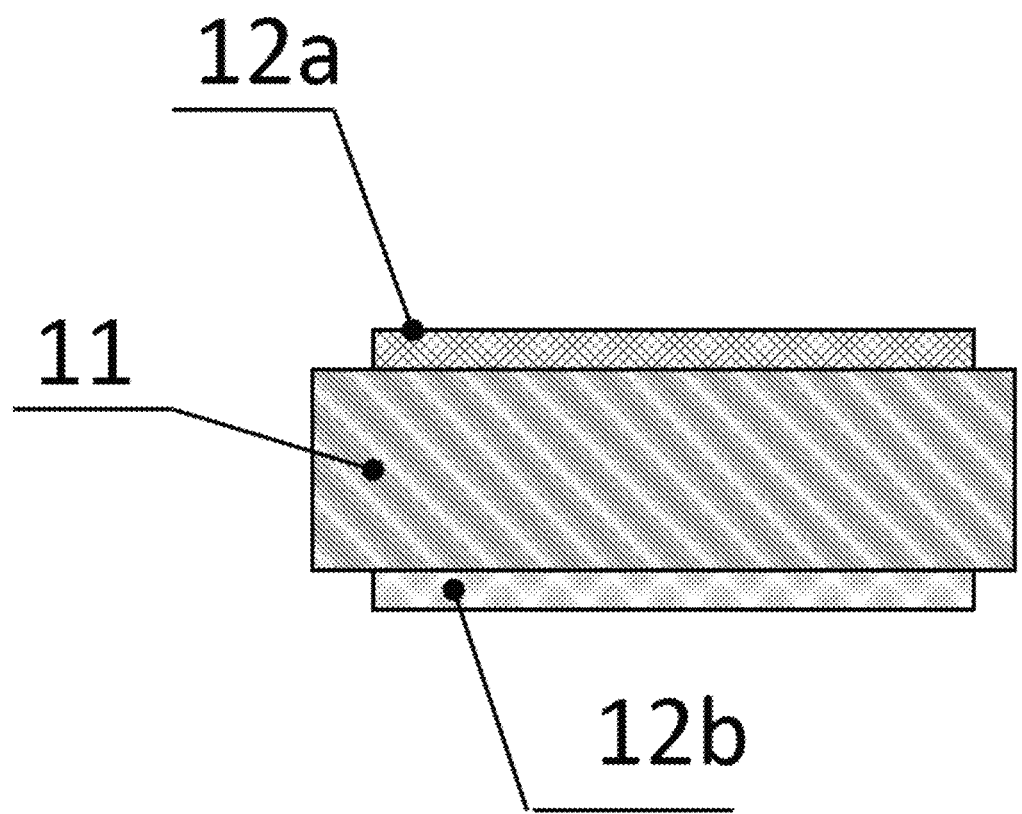
FIG. 1 illustrates a vertical Schottky barrier diode.

In the n-type aluminum nitride single crystal substrate 11 obtained as such, by forming the electrodes on the both planes of the substrate (for example on planes of top and bottom), the vertical semiconductor device can be produced. Also, in this vertical nitride semiconductor device, the ohmic electrode layer 12a is formed on one principal plane (for example, on top plane), and the Schottky electrode layer 12b is formed on other principal plane (for example, on bottom plane), thereby the vertical Schottky barrier diode can be made (FIG. 1). As other embodiment, aluminum gallium nitride ($Al_xGa_{1-x}N$, 0<x<1) layer can be appropriately formed between the electrodes and the n-type aluminum nitride single crystal substrate of the present invention. The aluminum gallium nitride layer can be n-type by silicon doping, also it can be p-type by Mg doping, and it may by undoped layer without doping the impurity. Also, the n-type aluminum nitride single crystal substrate can be used for the production of the horizontal nitride semiconductor device.

EXAMPLE

Hereinafter, the present invention will be described using the examples and the comparative examples; however the present invention is not to be limited thereto.

Example 1

For the aluminum nitride single crystal seed substrate for producing the n-type aluminum nitride single crystal substrate of the present invention, C-plane aluminum nitride single crystal seed substrate (15 mm×15 mm×thickness of 500 μm) was used. The dislocation density (the etch pit density) of this aluminum nitride single crystal seed substrate was $1\times10^4$ $cm^{-2}$. Note that, this dislocation density was obtained by the same measuring method as the dislocation density of the n-type aluminum nitride single crystal substrate described in below.

This seed substrate was put on the susceptor made of the pyrolytic boron nitride in HVPE reactor, then the pressure in HVPE reactor was set to 750 Torr, and the seed substrate was heated to 1430° C. under the atmosphere of mixed carried gas of hydrogen and nitrogen. Here, ammonia gas was supplied so that it was 0.5 vol % with respect to the entire carrier gas flow amount (10 slm). Next, the aluminum chloride gas obtained by reacting the metal Al heated to 450° C. and hydrochloride was supplied so that it satisfies 0.035 vol % with respect to the entire carrier gas, thereby 50 μm of the n-type aluminum nitride single crystal layer was formed on the seed substrate. Here, the VIII ratio was 14.3. At this time, the quarts (2 mm×2 mm×thickness of 1 mm) was placed on the susceptor, and by using the natural decomposition phenomena of the quartz when applying the heat, silicon was doped in the aluminum nitride single crystal layer. The quarts was put on the upstream side of the gas by 1 cm with respect to the seed substrate. The estimated growth rate according to the relation between the obtained n-type aluminum nitride single crystal layer and the growth time was 18 μm/h.

The multilayer substrate formed with the n-type aluminum nitride single crystal layer was taken out of HVPE reactor, then the X-ray rocking curve measurement of the (002) plane and (101) plane of the n-type aluminum nitride single crystal layer was carried out under the condition of the accelerating voltage of 45 kV and the accelerating electric current of 40 mA, using the high resolution X ray diffraction device (X'Pert made by Spectris Co., Ltd., PANalytical division). The full width at the half maximum of X-ray rocking curve was 28 arcsec and 19 arcsec, respectively.

Next, the photoluminescence measurement of the n-type aluminum nitride single crystal layer was carried out using the photoluminescence measurement system (LabRamHR-800 made by HORIBA, Ltd). For the excitation light source, ArF laser with peak wavelength at 193 nm was used (ExciStarS-200 made by Coherent Japan, Inc.). The laser was irradiated to the 30° inclined sample, and the luminescence generated from the sample was imaged to the focusing lens, and then detected by the spectrometer, thereby the spectrum intensity with respect to the wavelength was obtained. The measuring conditions were, the measuring temperature of the room temperature (23° C.), the irradiation time of 10 seconds, and the cumulative number of 3, the hole diameter of 1000 μm, and the grating was 300 grooves/mm. The band edge luminescence peak ($I_2$) was 209 nm, and weak luminescence peak ($I_2$) was observed near 380 nm. The ratio ($I_1/I_2$) of intensity of the peak was 0.13.

Then, the obtained aluminum nitride single crystal substrate was cut into a square shape of A1 to A4 having the size of 7 mm×7 mm. For A1 which was one of the cut substrates, the seed substrate part was removed by the mechanical polishing, thereby the free-standing n-type aluminum nitride single crystal substrate was produced. The size of the obtained free-standing substrate was 6.5 mm×6.5 mm×thickness of 39 μm, and it was transparent and colorless.

A2 was immersed for 5 min in the mixed solution of potassium hydroxide and sodium hydroxide which was heated to 300° C., then arbitrary 10 sites were observed within the vision range of 100 μm×100 μm by the differential interference microscope, thereby the etch pit density (the dislocation density) of the n-type aluminum nitride single crystal surface was observed. The calculated etch pit density (the dislocation density) was $2 \times 10^4$ cm$^{-2}$.

For A3, the quantitative analysis of silicon, oxygen and carbon was carried out by SIMS analysis using cesium ion as the primary ion. The concentration was quantified based on the nitrogen secondary ion intensity of the aluminum nitride standard sample. The silicon concentration was $3 \times 10^{17}$ cm$^{-3}$. Also, the oxygen and the carbon concentration were less than $1 \times 10^{17}$ cm$^{-3}$ (the detection limit for this measurement). Therefore, in this case, the acceptor impurity (carbon) concentration was considered $1 \times 10^{17}$ cm$^{-3}$ or less.

For A4, the surface was cleaned in hydrochloric acid at 40° C. Next, Ti (20 nm)/Al (100 nm)/Ti (20 nm)/Au (50 nm) electrode as the ohmic electrodes were formed at the four corners of the growth surface by the vacuum evaporation method, then the heat treatment was carried out under the condition of 950° C. in the nitrogen atmosphere. Then, using the Hall effect measuring system (Resitest8300 made by TOYO Corporation), the Hall effect measurement (the n-type conductivity evaluation) was carried out under the condition of the frequency of 100 mHz, the magnetic field of 0.38 T, the measurement temperature of 25 to 527° C. The electron concentration at room temperature (23° C.) was $2.4 \times 10^{14}$ cm$^{-3}$, and the ratio of the electron concentration with respect to the silicon concentration was 0.0008. Also, the estimated acceptor concentration according to the temperature dependency of the electron concentration was $8 \times 10^{16}$ cm$^{-3}$.

Comparative Example 1

The n-type aluminum nitride single crystal layer was grown under the same condition as the example 1 except for setting the growth temperature to 1450° C. and making the thickness to 200 μm, then the same evaluation was carried out. The growth rate of the estimated n-type aluminum nitride single crystal layer according to the substrate thickness was 22 μm/h. The ratio $(I_1/I_2)$ of the peak intensity obtained from the photoluminescence was 0.22. As similar to the example 1, the obtained aluminum nitride single crystal substrate was cut into square shape of B1 to B4 having the size of 7 mm×7 mm, and the same evaluation was carried out.

From B1, it was confirmed that the free-standing substrate having the size of 6 mm×6 mm×the thickness of 170 μm can be produced. For B2, the etch pit density was measured, which was $2 \times 10^4$ cm$^{-2}$. The silicon concentration obtained from B3 was $2 \times 10^{17}$ cm$^{-3}$, and the oxygen and the carbon concentration were less than $1 \times 10^{17}$ cm$^{-3}$ (the detection limit for this measurement). From B4, the electron concentration at room temperature (23° C.) of $5 \times 10^{13}$ cm$^{-3}$ was obtained, and the ratio of the electron concentration with respect to the silicon concentration was 0.00025. Also, the estimated acceptor concentration according to the temperature dependency of the electron concentration was $1 \times 10^{17}$ cm$^{-3}$.

Comparative Example 2

The n-type aluminum nitride single crystal layer of 100 μm was formed as the same condition as the example 1 except for changing the supplying amount of aluminum chloride gas to 0.043 vol % and to change the growth temperature to 1520° C. Here, the VIII ratio was 11.6. The growth rate was 32 μm/h. The ratio $(I_1/I_2)$ of the peak intensity obtained from the photoluminescence measurement was 0.81. As similar to the example 1, the obtained aluminum nitride single crystal substrate was cut into square shape of C1 to C4 having the size of 7 mm×7 mm, and the same evaluation was carried out.

From C1, it was confirmed that the free-standing substrate having the size of 6 mm×6 mm×the thickness of 70 μm can be produced. For C2, the etch pit density was measured, which was $2 \times 10^4$ cm$^{-2}$. The silicon concentration obtained from C3 was $2 \times 10^{17}$ cm$^{-3}$, and the oxygen and the carbon concentration were $1 \times 10^{18}$ cm$^{-3}$ and less than $1 \times 10^{17}$ cm$^{-3}$ (the detection limit for this measurement), respectively. From C4, the electron concentration at room temperature (23° C.) of $3 \times 10^{12}$ cm$^{-3}$ was obtained, and the ratio of the electron concentration with respect to the silicon concentration was 0.000015. Also, the estimated acceptor concentration according to the temperature dependency of the electron concentration was $1.9 \times 10^{17}$ cm$^{-3}$.

Comparative Example 3

The n-type aluminum nitride single crystal layer was grown as similar to the comparative example 1 except for setting 3 quartz (2 mm×2 mm×the thickness of 1 mm) on the sesceptor, and the same evaluation was carried out. The ratio $(I_1/I_2)$ of the peak intensity obtained from the photoluminescence measurement was 9.8. The estimated growth rate of the n-type aluminum nitride single crystal layer from the thickness of the substrate was 23 μm/h. As similar to the example 1, the obtained aluminum nitride single crystal substrate was cut into square shape of D1 to D4 having the size of 7 mm×7 mm, and the same evaluation was carried out.

From D1, it was confirmed that the free-standing substrate having the size of 6 mm×6 mm×the thickness of 170 μm can be produced. For D2, the etch pit density was measured, which was $3 \times 10^4$ cm$^{-2}$. The silicon concentration obtained from D3 was $8 \times 10^{19}$ cm$^{-3}$, and the oxygen and the carbon concentration were $5 \times 10^{17}$ cm$^{-3}$ and less than $1 \times 10^{17}$ cm$^{-3}$ (the detection limit for this measurement), respectively. From D4, the electron concentration at room temperature (23° C.) of $2 \times 10^{13}$ cm$^{-3}$ was obtained, and the ratio of the electron concentration with respect to the silicon concentration was 0.00000025. Also, the estimated acceptor concentration according to the temperature dependency of the electron concentration was $6 \times 10^{19}$ cm$^{-3}$.

Example 2

The n-type aluminum nitride single crystal layer was grown under the same condition as the example 1 except for setting 2 quarts on the susceptor, and the same evaluation was carried out. The ratio $(I_1/I_2)$ of the peak intensity obtained from the photoluminescence measurement was 0.42. The estimated growth rate of the n-type aluminum nitride single crystal layer from the thickness of the substrate was 20 μm/h. As similar to the example 1, the obtained aluminum nitride single crystal substrate was cut into square shape of E1 to E4 having the size of 7 mm×7 mm, and the same evaluation was carried out.

From E1, it was confirmed that the free-standing substrate having the size of 6 mm×6 mm×the thickness of 40 μm can be produced. For E2, the etch pit density was measured, which was $4.2 \times 10^4$ cm$^{-2}$. The silicon concentration obtained from E3 was $1 \times 10^{18}$ cm$^{-3}$, and the oxygen was $3 \times 10^{17}$ cm$^{-3}$ and the carbon concentration was less than $1 \times 10^{17}$ cm$^{-3}$ (the detection limit for this measurement), respectively. From E4, the electron concentration at room temperature (23° C.) of $7 \times 10^{14}$ cm$^{-3}$ was obtained, and the ratio of the electron concentration with respect to the silicon concentration was 0.0007. Also, the estimated acceptor concentration according to the temperature dependency of the electron concentration was $3 \times 10^{17}$ cm$^{-3}$.

Comparative Example 4

The n-type aluminum nitride single crystal layer under the same condition as the example 1 except for setting the growth temperature to 1450° C., and setting the volume flow amount ratio of the aluminum chloride gas to 0.05 vol %, and the same evaluation was carried out. Here, the V/III ratio was 10. The ratio ($I_1/I_2$) of the peak intensity obtained from the photoluminescence measurement was 0.37. The estimated growth rate of the n-type aluminum nitride single crystal layer from the thickness of the substrate was 32 μm/h. As similar to the example 1, the obtained aluminum nitride single crystal substrate was cut into square shape of F1 to F4 having the size of 7 mm×7 mm, and the same evaluation was carried out.

From F1, it was confirmed that the free-standing substrate having the size of 6 mm×6 mm×the thickness of 40 μm can be produced. For F2, the etch pit density was measured, which was $1 \times 10^5$ cm$^{-2}$. The silicon concentration obtained from F3 was $2 \times 10^{17}$ cm$^{-3}$, and the oxygen and the carbon concentration were less than $1 \times 10^{17}$ cm$^{-3}$ (the detection limit for this measurement). From F4, the electron concentration at room temperature (23° C.) of $8 \times 10^{13}$ cm$^{-3}$ was obtained, and the ratio of the electron concentration with respect to the silicon concentration was 0.0004. Also, the estimated acceptor concentration according to the temperature dependency of the electron concentration was $1.1 \times 10^{17}$ cm$^{-3}$.

Reference Example 1

The same evaluation was carried out for the commercially available aluminum nitride substrate produced by a sublimation method. The etch pit density was $9 \times 10^3$ cm$^{-2}$. The silicon concentration was $5 \times 10^{18}$ cm$^{-3}$, the oxygen concentration was $2 \times 10^{19}$ cm$^{-3}$, and the carbon concentration was $3 \times 10^{19}$ cm$^{-3}$. Also, when Hall effect measurement was carried out, an accurate measurement result was unable to obtain because the resistance value was too high. According to this result, the aluminum nitride substrate produced by the sublimation method is insulator, and the specific resistance value was estimated to be $10^6$ Ωcm or more. The ratio ($I_1/I_2$) of the peak intensity obtained from the photoluminescence measurement was 10 or more.

TABLE 1

|  |  |  | Example 1 | Comparative example 1 | Comparative example 2 | Comparative example 3 | Example 2 |
|---|---|---|---|---|---|---|---|
| Growth condition | Substrate temperature | ° C. | 1430 | 1450 | 1520 | 1450 | 1430 |
|  | V/III ratio | — | 14.3 | 14.3 | 11.6 | 14.3 | 14.3 |
|  | Growth rate | μm/h | 18 | 22 | 32 | 23 | 20 |
| AN single crystal layer | $I_1/I_2$ | — | 0.13 | 0.22 | 0.81 | 9.8 | 0.42 |
|  | Thickness | μm | 50 | 200 | 100 | 200 | 40 |
|  | e/Si | — | 0.0008 | 0.00025 | 0.000015 | 0.00000025 | 0.0007 |
|  | Dislocation density | cm$^{-2}$ | $2 \times 10^4$ | $2 \times 10^4$ | $2 \times 10^4$ | $3 \times 10^4$ | $4 \times 10^4$ |
|  | Acceptor concentration | cm$^{-3}$ | $8 \times 10^{16}$ | $1 \times 10^{17}$ | $1.9 \times 10^{17}$ | $6 \times 10^{19}$ | $3 \times 10^{17}$ |

|  |  |  | Comparative example 4 | Reference example |
|---|---|---|---|---|
| Growth condition | Substrate temperature | ° C. | 1450 | — |
|  | V/III ratio | — | 10 | — |
|  | Growth rate | μm/h | 32 | — |
| AN single crystal layer | $I_1/I_2$ | — | 0.37 | >10 |
|  | Thickness | μm | 40 | — |
|  | e/Si | — | 0.0004 | <0.0001 |
|  | Dislocation density | cm$^{-2}$ | $1 \times 10^5$ | $9 \times 10^3$ |
|  | Acceptor concentration | cm$^{-3}$ | $1 \times 10^{17}$ | — | e/Si: (electron concentration/silicon concentration) at 23° C.

The invention claimed is:

1. A n-type aluminum nitride single crystal substrate doped with silicon, comprising:
   an impurity concentration other than silicon which functions as a donor impurity and is equal or less than a silicon concentration,
   wherein:
   a ratio ($I_1/I_2$) between a luminescence spectrum intensity ($I_1$) of a peak at 370 to 390 nm and a luminescence peak intensity ($I_2$) of a band edge of aluminum nitride is 0.5 or less by a photoluminescence measurement at 23° C.,
   a thickness is 25 to 500 μm, and
   a ratio between an electron concentration and a silicon concentration at 23° C. is 0.0005 to 0.001.

2. The n-type aluminum nitride single crystal substrate as set forth in claim 1 wherein an acceptor concentration is $10^{18}$ cm$^{-3}$ or less and does not exceed the silicon concentration.

3. The n-type aluminum nitride single crystal substrate as set forth in claim 1, wherein a dislocation density is $10^6$cm$^{-2}$ or less.

4. The n-type aluminum nitride single crystal substrate as set forth in claim 1, wherein the electron concentration at 23° C. is $1\times10^{13}$ to $1\times10^{17}$ cm$^{-3}$.

5. A vertical nitride semiconductor device comprising an electrode layer on top and bottom of principal planes of the n-type aluminum nitride single crystal substrate as set forth in claim 1.

6. A vertical Schottky barrier diode comprising an ohmic electrode layer on one principal plane side and a Schottky electrode layer on the other principal plane of the n-type aluminum nitride single crystal substrate in the vertical nitride semiconductor device as set forth in claim 5.

7. The n-type aluminum nitride single crystal substrate as set forth in claim 1 wherein the impurity concentration other than silicon is $10^{17}$ cm$^{-3}$ or less.

\* \* \* \* \*